(12) United States Patent
Mueller

(10) Patent No.: US 8,482,259 B2
(45) Date of Patent: Jul. 9, 2013

(54) BATTERY CHARGE STATUS INDICATOR FOR USER TERMINAL DEVICE

(75) Inventor: Frank Mueller, Duesseldorf (DE)

(73) Assignee: Vodafone Holding GmbH, Dusseldorf (DE)

( * ) Notice: Subject to any disclaimer, the term of this patent is extended or adjusted under 35 U.S.C. 154(b) by 287 days.

(21) Appl. No.: 12/803,743

(22) Filed: Jul. 2, 2010

(65) Prior Publication Data

US 2011/0001457 A1    Jan. 6, 2011

(30) Foreign Application Priority Data

Jul. 3, 2009    (DE) .................... 10 2009 031 828 U

(51) Int. Cl.
*H02J 7/00*    (2006.01)
*H02J 7/04*    (2006.01)
*H04B 1/38*    (2006.01)

(52) U.S. Cl.
USPC ........... 320/136; 320/106; 320/152; 320/162; 455/573

(58) Field of Classification Search
USPC .................................. 320/136, 106, 152, 162
See application file for complete search history.

(56) References Cited

U.S. PATENT DOCUMENTS

| 5,596,261 | A  | * | 1/1997  | Suyama ........................ 320/152 |
| 6,445,162 | B1 | * | 9/2002  | Mukainakano ............... 320/132 |
| 7,424,378 | B2 |   | 9/2008  | Rieger |
| 7,554,293 | B2 | * | 6/2009  | Horigome ..................... 320/132 |
| 2010/0151918 | A1 | * | 6/2010 | Annambhotla et al. ....... 455/573 |
| 2010/0321193 | A1 | * | 12/2010 | Liao et al. ..................... 340/657 |

FOREIGN PATENT DOCUMENTS

DE    103 45 437 A1    5/2005

* cited by examiner

*Primary Examiner* — M'Baye Diao
(74) *Attorney, Agent, or Firm* — Lawrence G. Fridman

(57) ABSTRACT

The invention relates to an indicator device for displaying a battery charge status of an electronic battery powered user terminal device, which is adapted to provide a plurality of applications to a user. The user terminal device comprises a plurality of electric components performing the applications, a battery supplying power to the electric components and a power supply control deactivating the electric components of individual applications at a predetermined battery charge status respectively. The indicator device comprises a detection device for detecting the battery charge status of the user terminal device and a display for displaying the battery charge status. A charging state arrangement is provided for determining and displaying an application-specific battery charge state of at least one of the applications.

15 Claims, 1 Drawing Sheet

BATTERY CHARGE STATUS INDICATOR FOR USER TERMINAL DEVICE

FIELD OF THE INVENTION

The invention relates to battery driven user terminal devices in general, and in particular it relates to an indicator device for displaying a battery charge status of an electronic battery powered user terminal device.

BACKGROUND OF THE INVENTION

In general, a terminal for electronically generating, processing, exchanging and reproducing information or data for a user is denoted as user terminal device. For example, the data or information can be text, voice, music, pictures, animations, films or multimedia data. Known mobile battery driven user terminal devices are in particular mobile stations for a communication via a mobile telecommunication network according to the GSM (Global System for Mobile Communication) or UMTS (Universal Mobile Telecommunications System) standard, MP3 player (playback devices for audio data according to the Moving Pictures Experts Group Audio Layer 3 Format), PDAs (Personal Digital Assistants), Laptops, digital cameras, camcorder and navigation systems.

These user terminal devices increasingly provide multiple applications to a user. For example, mobile stations meanwhile usually comprise a digital camera and a MP3 player. Further examples are MP3 player and navigation systems which permit displaying digital pictures or videos, PDAs comprising mobile telephony or mobile stations with integrated navigation system. In addition many user terminal devices provide interfaces, for example according to the Bluetooth or USB (Universal Serial Bus) standard for using functions or applications of external devices.

Usually a single-use battery or a rechargeable accumulator is used as battery in a battery powered user terminal device. The battery status is displayed to a user by means of a battery status indicator. In this way the user is enabled to exchange a battery or recharge an accumulator in due time. Furthermore, the user can coordinate the usage of the user terminal device with the battery status.

In order to avoid an adverse complete discharge, a so-called deep discharge, of an accumulator and to terminate active applications secure and without data loss an automatic power-off of the user terminal is typically carried out at a predetermined threshold value. In addition, an early deactivation of applications or functions with low priority is well-known with battery driven user terminal devices providing multiple applications. These applications or functions are deactivated before reaching the above-mentioned threshold value in order to achieve a longer remaining runtime of the battery for important applications. For this procedure, for example, further threshold values can be used. Current mobile telephones, for example, firstly deactivate or switch off a camera, then a Bluetooth interface, and finally telephony and thereby the mobile telephone. In this way a longer runtime of the preferred telephony application of the mobile station is achieved.

The European patent specification EP 1 202 457 B1 describes a method for switching off battery supplied mobile stations. For this purpose the current battery voltage is periodically detected. The current state of the battery can be symbolically displayed to the user by a battery symbol on a display of the mobile station. The voltage supply is switched off when falling under a pre-set shut down voltage. This action is previously indicated to a user by an alarm signal, for example a flashing battery symbol. Different pre-set shut down voltages are possible for different operation states like talking mode or TX transmission burst.

The known user terminal devices with multiple applications and a deactivation of an individual application depending on the battery status have the disadvantage that it is irreproducible for the user if and when an individual application or functions is deactivated. These user terminal devices have a battery status indicator showing the user a charging status of the battery and indicating upcoming deactivation to the user. But it is not recognizable for a user by means of the battery status indicator, when and which application of the user terminal device is deactivated, because a deactivation depends on power requirement of active applications and the usage behavior of the user.

Thus it has been a long felt and unsolved need to avoid disadvantages of the prior art and to inform a user in an effective and user-friendly way about a deactivation of individual applications.

SUMMARY OF THE INVENTION

The invention relates to an indicator device for displaying a battery charge status of an electronic battery powered user terminal device, which is adapted to provide a plurality of applications to a user, wherein:
the user terminal device includes:
a plurality of electric components performing the applications,
a battery supplying power to the electric components, and
a power supply control deactivating the electric components of individual applications at a predetermined battery charge status respectively, and
the indicator device comprises:
a detection device detecting the battery charge status of the user terminal device, and
a display displaying the battery charge status.

Furthermore, the invention relates to an electronic battery powered user terminal device,
which is adapted to provide a plurality of applications to a user, wherein the user terminal device includes:
a plurality of electric components performing the applications,
a battery supplying power to the electric components,
a detection device detecting a battery charge status of the user terminal device,
a power supply control deactivating the electric components of individual applications at a predetermined battery charge status respectively,
a display displaying the battery charge status.

The invention further relates to a method for displaying a battery charge status of an electronic battery powered user terminal device, which is adapted to provide a plurality of applications to a user and thereto comprises a plurality of electric components performing the applications and a battery supplying power to the electric components, the includes the following:
detecting the battery charge status by a detection unit,
deactivating the electronic components of individual applications at a predetermined battery charge status by a power supply control respectively, and
displaying the battery charge status on a display.

One aspect of the invention provides an indicator device for displaying a battery charge status of an electronic battery powered user terminal device, which is adapted to provide a plurality of applications to a user, by charging state means determining and displaying an application-specific battery charge state of at least one of the applications.

Another aspect of the invention provides an electronic battery powered user terminal device which is adapted to provide a plurality of applications to a user. Charging state means are provided for determining and displaying an application-specific battery charge state of at least one of the applications.

A still another aspect of the invention provides a method for displaying a battery charge status of an electronic battery powered user terminal device, which is adapted to provide a plurality of applications to a user by determining and displaying an application-specific battery charge state of at least one of the applications by charging state means.

The invention is based on the principle of respectively displaying a application-specific battery charge state for each of several applications, which are deactivated on different predetermined battery charge status and thus at different times. The application-specific battery charge state differs from the battery charge status by considering the deactivation of the application depending on the battery charge status. For example, if an application is deactivated by the power supply control on half-full battery, the application-specific battery charge state of this application indicates an insufficient charge state or an "empty" battery on half-full battery.

An application-specific battery charge state for each application is indicated to the user by the indicator device according to the invention and the user terminal device according to the invention. This information very effectively indicates an upcoming deactivation of an application to a user. User-friendly, the user will be able to adapt his usage behavior according to the determined and displayed application-specific battery charge state. In particular the user will not be surprised by a deactivation of an application although the battery charge status of the user terminal device indicates sufficient battery charge for operating the user terminal device.

Corresponding advantages are achieved by the inventive method for displaying a battery charge status of an electronic battery powered user terminal device. In turn the user is informed in good time about a deactivation of an application and can arrange his usage behavior accordingly.

Preferably in one modification of the indicator device according to the invention the charging state means are adapted to determine the application-specific battery charge state of an application using the battery charge status and a predetermined deactivation priority of the application. In doing so the indicator device according to the invention is particularly suitable for user terminal devices, which assign different priorities to several applications and deactivate individual applications in each case in dependence of a battery charge status and a priority. With this modification the determination of the application-specific battery charge state in such user terminal devices can be performed easily and quickly.

A further preferred modification of the indicator device according to the invention is achieved by runtime determination means determining and displaying a remaining runtime of the application depending on the application-specific battery charge state and a power consumption of active applications. In this way a user is very user-friendly informed about remaining runtimes of individual applications and can adapt his usage behavior accordingly. The user is provided with information on the moment of deactivation of an application at all times for different applications. Thus, a deactivation surprising the user is effectively avoided.

An advantageous modification of the indicator device according to the invention is achieved by providing switching means for activating or deactivating at least one application by the user. This measure provides the user with an extensive influence on the deactivation of applications. A deactivation of not required applications is feasible as needed. This leads to a longer runtime of the remaining active applications. Further on, an activation of an already deactivated application is possible, if the user wants to use such an application urgently.

A further advantageous modification of the indicator device according to the invention provides means for displaying a battery capacity utilization of an application. Depending on the energy demand different applications or electric components of the user terminal device used by an application burden the battery differently. By indicating the battery capacity utilization or the energy demand of an application the user obtains important information according to which he can adapt his usage behavior. For example, a decision of disusing or deactivating an application is considerably simplified.

Further on, a favorable modification of the indicator device according to the invention is achieved by providing adjusting means for predetermining or changing the deactivation priority of an application. A customization of the deactivation priority of an application depending on the battery charge status is permitted user friendly. A sequence of automatic deactivations of different applications can be advantageously set up by the user according to his needs and wishes.

In a preferred modification of the inventive battery driven user terminal device the charging state means are adapted to determine the application-specific battery charge state of an application using the battery charge status and a predetermined deactivation priority of the application. On the basis of a predetermined priority an application is deactivated by a power supply control on a predetermined battery charge status. In doing so a contemporaneous deactivation of multiple applications having the same priority is possible. By utilization of the priority of an application and a battery charge status of the user terminal device an efficient determining of application-specific battery charge states is feasible.

In an advantageous modification of the invention the user terminal device is a mobile station for a mobile telecommunication network. Modern mobile stations usually provide multiple applications to a user, for example telephony, text messages, games, generating and displaying photos and videos and playing back music. Thus, the invention can be applied particular advantageously to mobile stations. A user terminal device being a mobile station informs the user about an application-specific battery charge state of the applications and hence, about upcoming deactivations of individual applications at all times.

A preferred modification of the method according to the invention for displaying a battery charge status of an electronic battery powered user terminal device also uses the battery charge status and a predetermined deactivation priority of the application for determining the application-specific battery charge state of an application. Thus, corresponding to the respective modification of the inventive user terminal device and the inventive indicator device a quick and efficient determination of application-specific battery charge states is enabled.

Further modifications of the user terminal device and the method respectively correspond with the modification of the indicator device described above.

BRIEF DESCRIPTION OF THE DRAWING

Exemplary embodiments of the invention are described below in greater detail with reference to the accompanying drawings, in which.

DETAILED DESCRIPTION OF THE INVENTION

Figure 1:
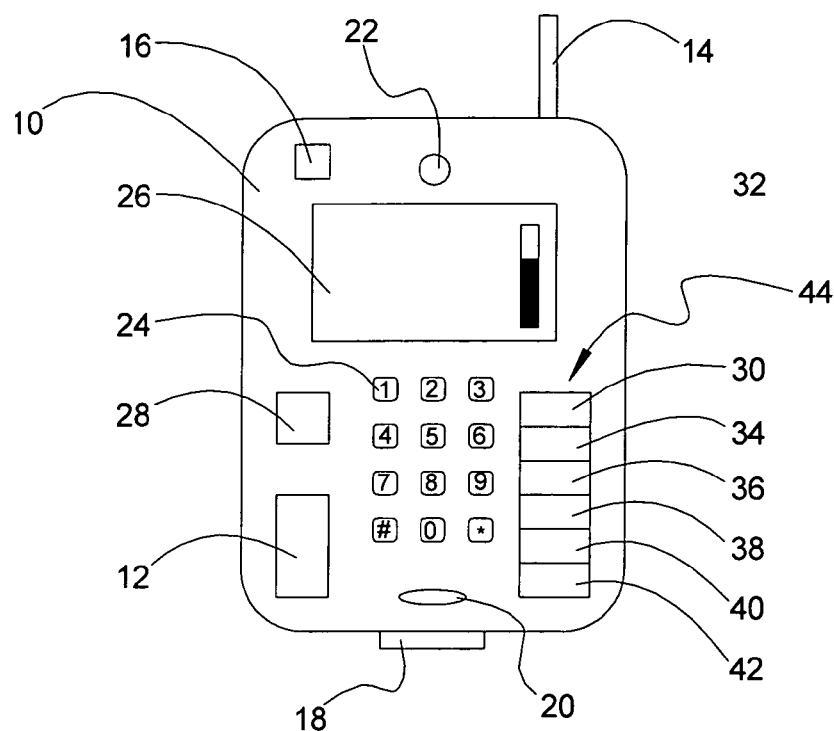
FIG. 1 is a diagram of an exemplary embodiment of an indicator device according to the invention for a user terminal device.

Referring to FIG. 1, the numeral 10 denotes an electronic battery powered user terminal device. A rechargeable battery 12 is provided as energy supply for the user terminal device 10. Alternatively, the usage of a single-use battery is also possible. In this embodiment the user terminal device 10 is designed as a mobile station and, among other components known by a person skilled, in particular comprises a mobile radio module 14 for transmitting and receiving data via a mobile telecommunication network according to the GSM (Global System for Mobile Communication) or the UMTS (Universal Mobile Telecommunications System) standard.

In other embodiments the user terminal device 10, for example, is a MP3 player (play back device for audio data in the Moving Picture Experts Group Audio Layer 3 format), a PDA (personal digital assistant), a laptop, a digital camera, a camcorder or a navigation system. In general the electronic battery powered user terminal device 10 is characterized by electronically generating, processing, exchanging and playing back information or data for a user. Thus, it is an interface between a user and electronically available data or information. For example, the data or information can be text, voice music, pictures, animations, movies or multimedia data.

The user terminal device 10 provides multiple applications to the user and comprises the necessary electronic components for this purpose. Possible applications for example are: telephony; WAP (Wireless Application Protocol), SMS (Short Message Service), EMS (Enhanced Messaging Service) and MMS (Multimedia Messaging Service) applications; email, Internet, WWW (World Wide Web); organizer; address book; image and video recording; playing back music, pictures or videos; games; satellite based navigation and different interfaces for utilizing applications of external devices, for example USB (Universal Serial Bus), Bluetooth or IrDa (Infrared Data Association).

In the following only three exemplary applications of the user terminal device 10 are contemplated in order to simplify matters. First of all the user terminal device 10 permits a recording of pictures or videos and therefore comprises a digital camera 16 as electric component. Secondly, an application of external devices is accomplishable via a Bluetooth interface 18 as electric component. Thirdly the user terminal device 10 enables telephony for the user and for this purpose comprises a microphone 20, a loud speaker 22, the mobile radio module 14 and all other necessary electric components.

A control unit 24 and a display 26 are provided for controlling and using the user terminal device 10 by the user. Besides controlling, status and operating information of the user terminal device 10 the display 26 can also show application data like pictures or videos.

A power supply for the electric components of the user terminal device 10 is controlled by a power supply control 28. On the one hand, the power supply control 28 switches off the user terminal device 10 at a predetermined minimum load of the battery 12 and terminates all applications or deactivates all electronic components of the user terminal device for this purpose. In this way all applications are correctly terminated and a damaging total discharge of the battery 12 is avoided. On the other hand individual applications or the corresponding electronic components are deactivated before reaching the minimum load at further predetermined remaining loads of the battery 12 by the power supply control 28 in order to increase the runtime of important applications. For this purpose the power supply control 28 uses predetermined priorities of the applications and remaining load values of the battery 12 associated with them. When reaching one of those remaining load values all applications with the corresponding priority are deactivated.

The charging status of the battery 12 is detected as battery charge status by a detecting device 30. To this end, for example, a continuous or periodical examination of the battery voltage can be carried out. For example the battery charge status can be available in percentage and the reaches from 100% for a completely loaded battery 12 to 0% for a discharged battery 12. By comparing the actual battery charge status with predetermined battery charge status as predetermined remaining load values the power supply control 28 determines if individual applications or the complete user terminal devices 10 has to be deactivated. In this exemplary embodiment the battery charge status is displayed to the user as a bar 32 on the display 26. A completely filled bar 32 corresponds to a completely charged battery 12 and a bar 32 without filling corresponds to a discharged battery 12.

Furthermore the user terminal device 10 comprises charging state means 34 for determining and displaying an application-specific battery charge state of each application. The application-specific battery charge state differs from the battery charge status by consideration of the deactivation of an application depending on the battery charge status. This circumstance is described in greater detail further below. The charging state means 34 determine the application-specific battery charge state of an application by means of the actual battery charge status and the predetermined priority of the respective application.

A remaining runtime of each application is determined and displayed on the display 26 for the user by remaining runtime determination means 36 using the application-specific battery charge state of an application and a power consumption of active applications. In addition a battery capacity utilization or power consumption of an application is displayed on the display 26 for the user by means 38 for displaying the battery capacity utilization of an application (see FIG. 2).

Adjusting means 40 are provided in the user terminal device 10 for predetermining or changing the priority of an application by the user. Furthermore, activating or deactivating of individual applications by the user is possible by using switching means 42. The adjusting means 40 and the switching means 42 are operated by the user by means of the control unit 24 and the display 26. For this purpose, for example, menus, icons or soft keys can be used on the display 26, which are selected by the user via the control unit 24.

The detecting device 30, the display 26, the charging state means 34, the remaining runtime determination means 36, the means 38 for displaying the battery capacity utilization, the priority adjusting means 40 and the switching means 42 all together set up an indicator device 44 for displaying a battery charge status and application-specific battery charge states. Instead of the display 26 of the user terminal device 10 another display can be used. The same applies for the detecting device 30.

Figure 2:
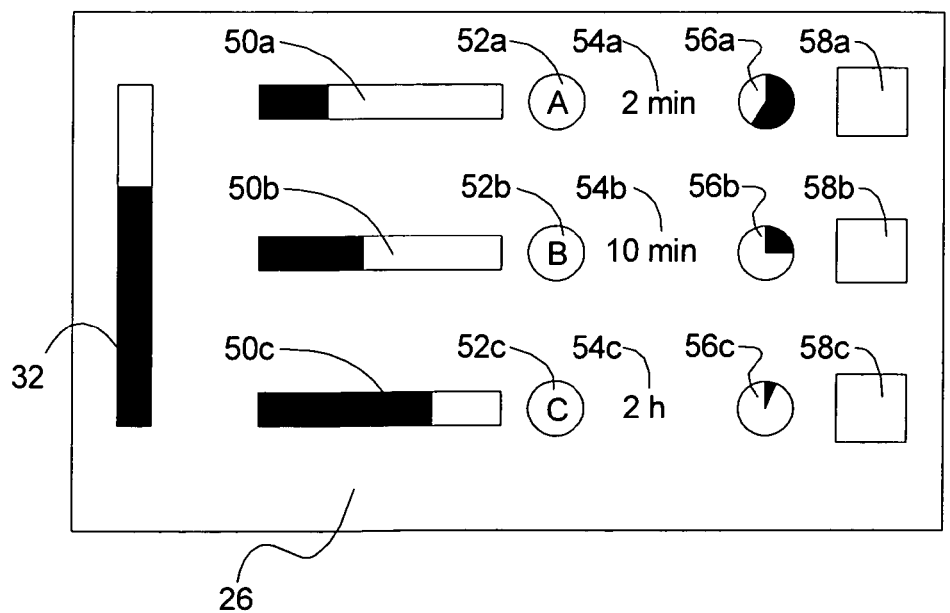
FIG. 2 is a principle diagram which shows a section of a display of the exemplary embodiment according to FIG. 1.

In the following the functionality of the indicator device 44 is described together with an according exemplary method for displaying a battery charge status and application-specific charge states. Thereby reference is made to FIG. 1 and FIG. 2. In FIG. 1 and FIG. 2 corresponding elements are denoted with the same reference numerals. As mentioned above, three applications and their electronic components are exemplary considered, namely the digital camera 16, the Bluetooth interface 18 and telephony. The indicator device 44 and the method can also be used with less or more applications.

When using the user terminal device 10 the battery charge status is permanently shown to the user by bar 32, see FIG. 1. For obtaining more information, in particular about a deactivation of applications, the user invokes the indicator device 44 using the control unit 24. For this purpose, for example, the bar 32 can be a selectable icon or soft key. Thereupon the indicator device 44 displays amongst others the application-specific battery charge states, remaining runtimes and battery capacity utilizations of individual applications on the display 26 for the user.

FIG. 2 schematically shows an exemplary section of the display 26 with this information. Besides the bar 32 of the battery charge status an application-specific battery charge state of the digital camera 16 is displayed as bar 50a together with a symbol or text 52a as designator. Since the digital camera 16 has a low priority and is deactivated previous to the Bluetooth interface 16 and telephony by the power supply control 28, the application-specific battery charge state 50a of the digital camera 16 differs from the battery charge status 32.

Furthermore, a remaining runtime 54a until deactivation and a battery capacity utilization 56a of the digital camera 16 is displayed. The battery capacity utilisation 56a describes the power consumption of the digital camera 16. All these values can be shown symbolical or as text. In addition, a symbol 58a as status of the digital camera 16 indicates, whether the digital camera 16 is activated or deactivated. Simultaneously, the symbol 58a is a selectable symbol or soft key used by the user for operating the switching means 42 for activating or deactivating the digital camera 16.

Accordingly, an application-specific battery charge state 50b, a designator 52b, a remaining runtime 54b, a battery capacity utilisation 56b and a status and switching symbol 58b of the Bluetooth interface 18 and an application-specific battery charge state 50c, a designator 52c, a remaining runtime 54c, a battery capacity utilisation 56c and a status and switching symbol 58c for telephony is displayed. The Bluetooth interface 18 has a medium priority and telephony has a high priority. Because of this telephony is deactivated together with the user terminal device 10 by the power supply control 28 at the minimum load of the battery for operation. Thus, the application-specific battery charge state 50c of telephony is equal to the battery charge status 32. Since the Bluetooth interface 18 is deactivated by the power supply control 28 at a remaining load value of the battery 12 between the remaining load value of the digital camera 16 and the minimum load of the battery, the application-specific battery charge state 50b of the Bluetooth interface 18 differs from the one of the digital camera 16 and the one for telephony.

The user is provided with substantial information by the indicator device 44 and the according method in order to be prepared for upcoming deactivations of individual applications and to arrange his user behavior accordingly. Furthermore, an extensive influence on the deactivation and activation of applications by the user terminal device 10 is enabled for the user by the priority adjusting means 40 and the switching means 42 provided in the indicator device 44.

What is claimed is:

1. An indicator device for displaying a battery charge status of an electronic battery powered a user terminal device, adapted to provide a plurality of applications to a user, said user terminal device comprises:
    a plurality of electric components performing a plurality of individual applications,
    a battery supplying power to said electric components,
    a power supply control switching off a user terminal device at a predetermined minimum load of the battery and deactivating said electric components performing said individual applications before reaching said minimum load at a further predetermined battery charge statuses respectively;
    said indicator device comprises:
    a detection device detecting said battery charge status of said user terminal device;
    a display displaying said battery charge status;
    a charging state arrangement determining and displaying an application-specific battery charge state considering deactivation of at least one of said applications depending on the battery charge status, in addition to said displayed battery charge status; and
    said charging state arrangement is adapted to determine said application-specific battery charge state of at least one of said applications using said battery charge status and a predetermined deactivation priority of the application.

2. An indicator device according to claim 1, further comprising a runtime determination arrangement for determining and displaying a remaining runtime of at least one of said applications depending on said application-specific battery charge state and a power consumption of active applications.

3. An indicator device according to claim 1, wherein a switching arrangement is provided for activating or deactivating at least one said applications by the user.

4. An indicator device according to claim 1, further comprising an arrangement for displaying a battery capacity utilization of at least one of said applications.

5. An indicator device according to claim 1, wherein an adjusting arrangement is provided for predetermining and/or changing the deactivation priority of at least one of said applications.

6. An electronic battery powered a user terminal device adapted to provide a plurality of applications to a user, said user terminal device comprises:
    a plurality of electric components performing said applications;
    a battery supplying power to said electric components;
    a detection device detecting a battery charge status of said user terminal device;
    a power supply control switching off a user terminal device at a predetermined minimum load of the battery and deactivating said electric components of individual applications before reaching said minimum load at further predetermined battery charge statuses respectively;
    a display displaying said battery charge status;
    a charging state arrangement is provided for determining and displaying an application-specific battery charge state of at least one of said applications in addition to said displayed battery charge status; and
    said charging state arrangement determines said application-specific battery charge state of at least one of said applications using said battery charge status and a predetermined deactivation priority of the application.

7. An electronic battery powered user terminal device according to claim 6, wherein a runtime determination arrangement is provided for determining and displaying a remaining runtime of at least one of said applications depending on said application-specific battery charge state and a power consumption of active applications.

8. An electronic battery powered user terminal device according to claim 6, wherein a switching arrangement is provided for activating or deactivating at least one of said applications by the user.

9. An electronic battery powered user terminal device according to claim 6, wherein said user terminal device is a mobile station for a mobile telecommunication network.

10. A method for displaying a battery charge status of an electronic battery powered user terminal device, which is adapted to provide a plurality of applications to a user, wherein said user terminal device comprises a plurality of electric components performing said applications and a battery supplying power to said electric components, the method comprising the steps of:
   detecting said battery charge status by a detection unit;
   switching off a user terminal device at a predetermined minimum load of the battery;
   deactivating electric components of individual applications before reaching said minimum load at further predetermined battery charge statuses by a power supply control respectively;
   displaying said battery charge status on a display; and
   determining and displaying an application-specific battery charge state of at least one of said applications by charging state means in addition to said displayed battery charge status;
   wherein said charging state arrangement determines said application-specific battery charge state of at least one of said applications using said battery charge status and a predetermined deactivation priority of the application.

11. A method for displaying a battery charge status according to claim 10, wherein said battery charge status and a predetermined deactivation priority of at least one of said applications are used for determining said application-specific battery charge state of the application.

12. A method for displaying a battery charge status according to claim 10, further comprising the step of determining and displaying a remaining runtime of at least one of said applications depending on said application-specific battery charge state and a power consumption of active applications by runtime determination means.

13. A method for displaying a battery charge status according to claim 10, wherein activating and/or deactivating of at least one of said applications by the user is provided.

14. A method for displaying a battery charge status according to claim 10, further comprising the step of displaying a battery capacity utilization induced by at least one of said applications.

15. A method for displaying a battery charge status according to claim 11, further comprising the step of predetermining and/or changing said deactivation priority of at least one of said applications by adjusting means.

* * * * *